United States Patent
Peng et al.

(10) Patent No.: US 6,492,263 B1
(45) Date of Patent: Dec. 10, 2002

(54) DUAL DAMASCENE PROCESS WHICH PREVENTS DIFFUSION OF METALS AND IMPROVES TRENCH-TO-VIA ALIGNMENT

(75) Inventors: Hsin-Tang Peng, Hsinchu (TW); Fu-Cheng Lin, Hsinchu (TW); Chun-Wei Chen, Hsinchu (TW)

(73) Assignee: Mosel Vitelic, Inc., Hsin-Chu (TW)

( * ) Notice: Subject to any disclaimer, the term of this patent is extended or adjusted under 35 U.S.C. 154(b) by 35 days.

(21) Appl. No.: 09/684,038

(22) Filed: Oct. 6, 2000

(30) Foreign Application Priority Data

Jun. 29, 2000 (TW) ........................... 89112939 A

(51) Int. Cl.$^7$ ............................................. H01L 21/44
(52) U.S. Cl. ........................................................ 438/639
(58) Field of Search ................................ 438/639, 637, 438/678, 680, 687, 597, 618

(56) References Cited

U.S. PATENT DOCUMENTS

| | | | |
|---|---|---|---|
| 5,985,762 A | * | 11/1999 | Geffken et al. ............. 438/687 |
| 6,040,243 A | * | 3/2000 | Li et al. ...................... 438/687 |
| 6,284,657 B1 | * | 9/2001 | Chooi et al. ................. 438/687 |
| 6,358,842 B1 | * | 3/2002 | Zhou et al. .................. 438/633 |

* cited by examiner

Primary Examiner—Richard Elms
Assistant Examiner—Beth E. Owens
(74) Attorney, Agent, or Firm—Thomas, Kayden, Horstemeyer & Risley

(57) ABSTRACT

Disclosed is a dual damascene process for a semiconductor device with two low dielectric constant layers in a stack thereof, in which a via hole and a trench connecting with the via hole are formed respectively in the dielectric layers and a conductor is filled in the via hole and the trench to connect with a conductive region below the via hole after a barrier layer between the via hole and the conductive region is removed. A liner is deposited on the sidewalls of the dielectric layers in the via hole and the trench before the removal of the barrier layer to prevent particles of the conductive region such as copper from sputtering up to the dielectric layers when removing the barrier layer. An etch-stop layer inserted between the dielectric layers is pulled back to be spaced from the via hole with a distance to improve the trench-to-via alignment.

9 Claims, 8 Drawing Sheets

DUAL DAMASCENE PROCESS WHICH PREVENTS DIFFUSION OF METALS AND IMPROVES TRENCH-TO-VIA ALIGNMENT

FIELD OF THE INVENTION

The present invention relates generally to the manufacture of semiconductor device, and more particularly, to a dual damascene process and structure for interconnect within an integrated circuit (IC) in a semiconductor device.

BACKGROUND OF THE INVENTION

Multilayer conductor such as metal is generally formed within an IC during the manufacture of a semiconductor device. When the design rule of the semiconductor device is scaled down to under 1 μm(micron), the multilayer conductor must be applied adaptively to the high density of the semiconductor device. Similarly, the size of the wiring structure also has to be shrunk adaptively to the smaller device size. More advanced wiring structure and new material are therefore required when IC technology is developed to the range of 0.25μm. A dual damascene is thus used for such structure. The dual damascene process provides advantages of process simplification by decreasing steps of forming via holes and trenches, in which openings of metal layer wiring and via holes to connect with the underlying metal layers are produced at the same time, the procedure is advantageous to the lithography process and improves critical dimension (CD) control. Then metal is filled in the via holes and trenches by the same metal filling process, so that process steps are decreased.

Due to the simplification of steps implemented in the dual damascene process, the current use of aluminum (Al)/silicon dioxide ($Si_{O2}$) system can be readily replaced with new materials for the dual damascene process. One of the new materials is copper (Cu). The use of Cu metalization can enhance signal transmission performance and reliability by aluminum. However, some problems hard to overcome are present when copper is applied for the Al prior art. For instance, a barrier layer is not needed between an Al metal wire and a $SiO_2$ inter-metal dielectric (IMD) in a conventional Al interconnect structure, however, copper must be isolated from surrounding IMD when it is used, since copper is easy to diffuse/drift to adjacent dielectrics.

FIG. 1 shows a prior art process flow for a Cu self-aligned dual damascene. As shown in FIG. 1a, a barrier layer 12, a low dielectric constant layer 14, and an etch-stop layer 16 are formed in stack onto a copper region 10. A portion of the etch-stop layer 16 is removed with a photoresist 18 to serve as a mask to form an opening 20 to be that shown in FIG. 1b. In FIG. 1c, a second low dielectric constant layer 22 overlays on the intermediate etch-stop layer 16 and fills in the opening 20, and is overlaid with a bottom anti-reflection coating (BARC) 24. Then a photoresist 26 is patterned and used as a mask as shown in FIG. 1d, and an etching process is applied based on the pattern of the photoresist 26, in order to remove a portion of the BARC 24, the underlying second low dielectric constant layer 22 not covered with the photoresist 26, and the portion of the first low dielectric constant layer 14 through the opening 20 to the top surface of the barrier layer 12 to form a trench 28 and a via hole 29, as shown in FIG. 1e. After the photoresist 26 is removed, the exposed portion of the barrier layer 12 underneath the via hole 29 is removed to expose the copper region 10, as shown in FIG. 1f. The subsequent process is to fill in the trench 28 and the via hole 29 with a conductor (not shown in the figure) to connect to the underlying copper region 10.

Some problems exist in the above-described process. Although the dual damascene shown in FIG. 1 is a clean process since there is no photoresist in the via hole 29 and there is no concern of the crown-like fence over the via, high etching selectivity to the intermediate barrier 14 in open area and via bottom and high overlay accuracy on photoresist patterning for dual damascene etching are very concerned. It therefore requires a thicker etch-stop layer 16 and accurate trench-to-via photo alignment control. In actual process, a thick etch-stop layer 16 will increase the equivalent dielectric constant so as to be unable to meet the low dielectric constant requirement, resulting in the increase of RC delay and disadvantages to circuit performance. On the contrary, a thin etch-stop layer 16 will make optical path difference insufficient, resulting in a weak alignment signal for wafer alignment in the subsequent process, probably causing misjudgment on the alignment step and thereby misalignment of the trench 28 to the via hole 29, and thus increasing-resistance of the dual damascene structure. Based on same design rule, even though increasing etch selectivity of dielectric to etch-stop layer, the photo alignment signal is still weak. Furthermore, another disadvantage is contamination caused by the subsequent etching process. In FIG. 1f, exposed underlying copper region 10 will sputter up onto the sidewall of the via hole 29 to cause intra-layer metal line short when the exposed portion of the barrier layer 12 underneath the via hole 29 is etched.

It is therefore desired to provide a dual damascene process and structure to improve the trench-to-via alignment and out-diffusion of metal particles, such as copper.

SUMMARY OF THE INVENTION

An object of the present invention is to provide a dual damascene process and structure for out-diffusion prevention of metal particle such as copper, in which a liner deposition is applied before the barrier layer between the via and the underlying conductive region is etched. The liner on the sidewall of the via hole could be a barrier to sputtered species for the dielectric while particles are sputtered up from the conductive region onto the sidewall of the via hole during the removal step for the barrier layer on the conductive region.

Another object of the present invention is to provide a dual damascene process and structure including a liner deposition of a material with a different refractive index from that of the intermediate etch-stop layer covered by the liner in order to more clearly distinguish the interface of oxide-liner-oxide on the sidewall of the via and then to increase trench-to-via alignment accuracy.

A further object of the present invention is to provide a dual damascene process and structure to enhance signal for both broad band and laser alignment system by pull-back of the intermediate etch-stop layer between the stacked low dielectric constant layers to produce optical path difference for the subsequent photo alignment.

In one aspect of the present invention, a dual damascene process for a semiconductor device with a barrier layer, a first low dielectric constant layer, and a first etch-stop layer in stack thereof comprises depositing a liner after forming a via hole extending through the first etch-stop layer and the first low dielectric constant layer to a surface of the barrier layer, forming a second low dielectric constant layer, a second etch-stop layer or BARC, and a trench extending through the second etch-stop layer and the second low dielectric constant layer and connecting with the via hole, removing a portion of the barrier layer underneath the via hole, and filling in the trench and the via hole with a conductor after depositing a passivation layer such as Ta/TaN for a Cu region.

In another aspect of the present invention, a dual damascene process for a semiconductor device with a barrier layer, a first low dielectric constant layer, a first etch-stop layer, a second low dielectric constant layer, and a second etch-stop layer in stack thereof comprises depositing a liner after forming a via hole extending through the first etch-stop layer and the first low dielectric constant layer to a surface of the barrier layer and a trench extending through the second etch-stop layer and the second low dielectric constant layer and connecting with the via hole, removing a portion of the barrier layer underneath the via hole, and filling in the trench and the via hole with a conductor after depositing a passivation layer such as Ta/TaN for a Cu region.

According to the present invention, liner deposition and pull-back of intermediate etch-stop layer are provided for a dual damascene process and structure to prevent out-diffusion of metal such as copper from the via hole and improve photo alignment signal.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION

Figure 1A:
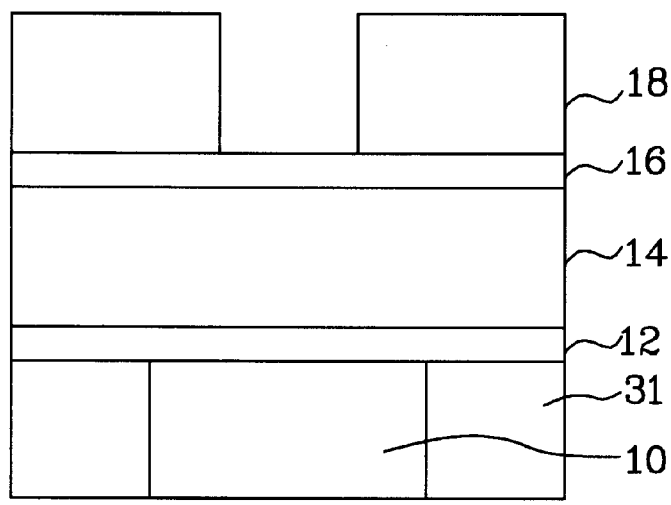
FIGS. 1a–1f shows a prior art process flow for a Cu self-aligned dual damascene.
Figure 1B:
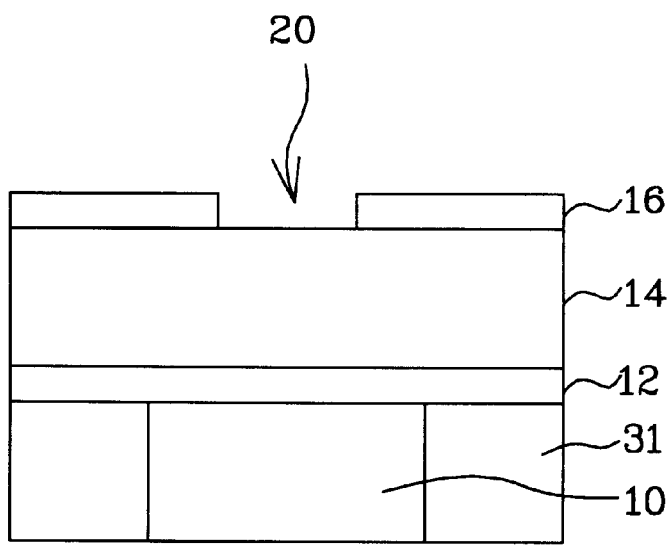
Figure 1C:
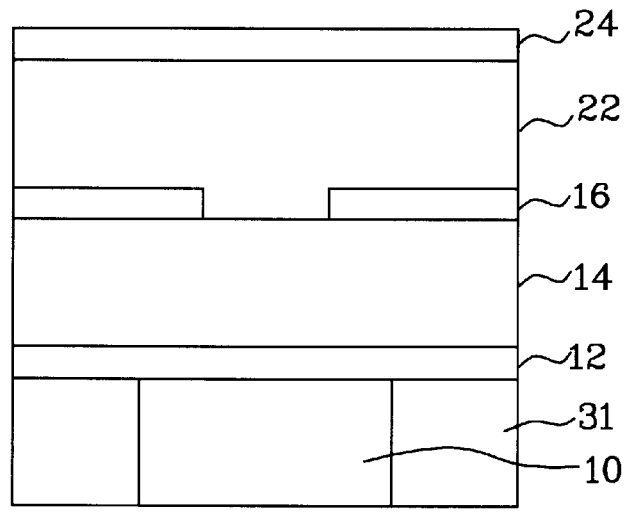
Figure 1D:
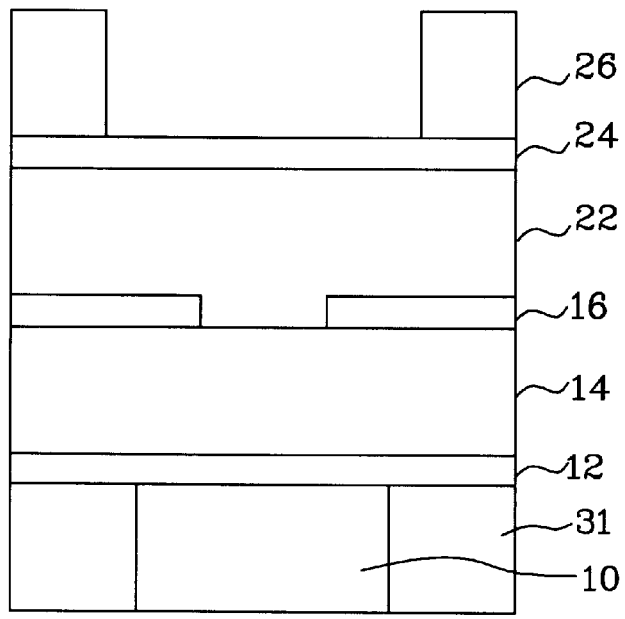
Figure 1E:
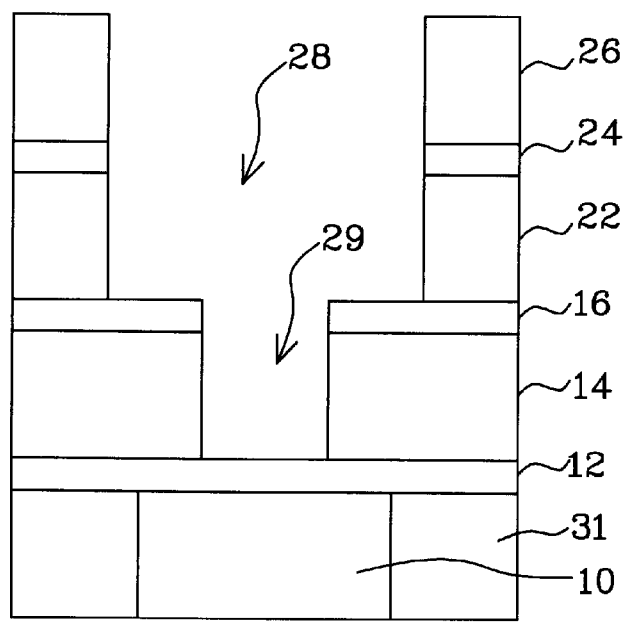
Figure 1F:
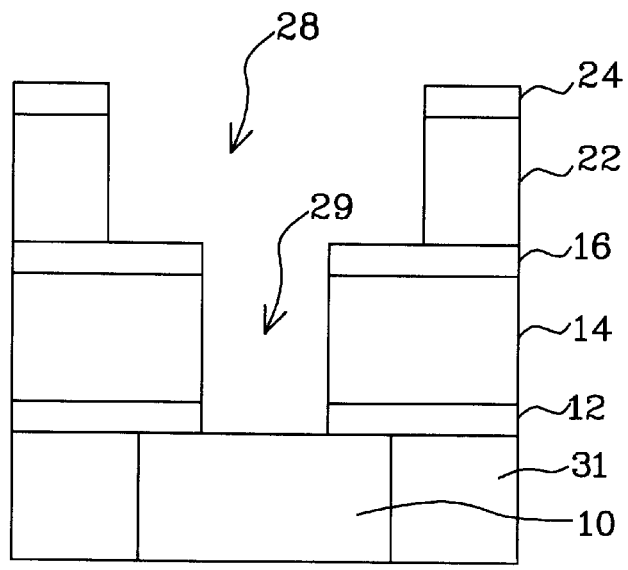

FIG. 2 shows an embodiment of the present invention. As shown in FIG. 2a, a conductive region 30 is formed in a dielectric layer 31 before a dual damascene process. A barrier layer 32 is overlaid on the conductive region 30. Then a low dielectric constant layer 34 and an etch-stop layer 36 are formed in stack onto the barrier layer 32, and a photoresist 38 is coated onto the etch-stop layer 36. To serve as wire for semiconductor components, plug for interconnect, or contact region, the conductive region 30 is a doped region or is formed of a conductor, such as aluminum, aluminum alloy and copper. Barrier layers should be inserted between the conductive region 30 and the dielectric layer 31 for out-diffusion prevention when the conductive region 30 comprises copper or the like. In this embodiment, the barrier layer 32 can fully cover the dielectric layer 31 and the conductive region 30. In other embodiments, a barrier layer can selectively cover only the conductive region 30. The etch-stop layer 36 and the barrier layer 32 are formed of different materials. Preferably, the etch-stop layer 36 is a $SiO_2$, while the barrier layer 32 is a $Si_3N_4$. A portion of the photoresist 38 is removed by exposure and development, and the remaining photoresist 38 is used as a mask for the subsequent etching process. The underlying etch-stop layer 36 and the low dielectric constant layer 34 are etched to form a via hole 40 on the basis of the pattern of the photoresist 38. Then the photoresist 38 is removed as shown in FIG. 2b.

Figure 2A:
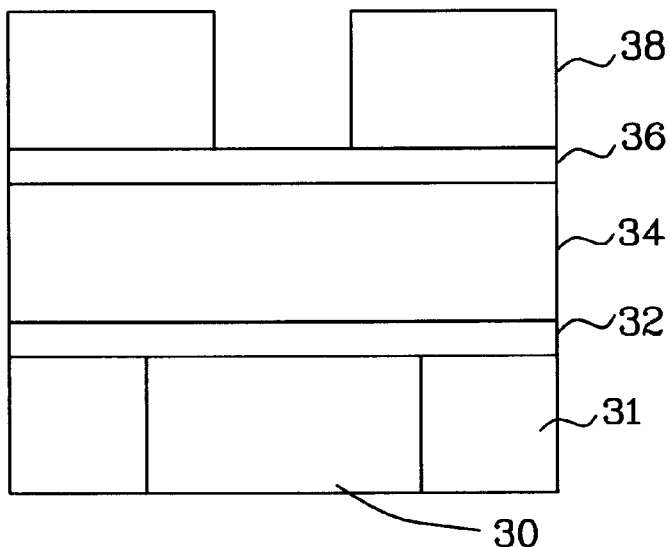
FIGS. 2a–2f shows cross sectional views during a process flow for a dual damascene according to an embodiment of the present invention, in which a pull-back step for the intermediate etch-stop layer and a liner deposition for the first low dielectric constant layer are provided.
Figure 2B:
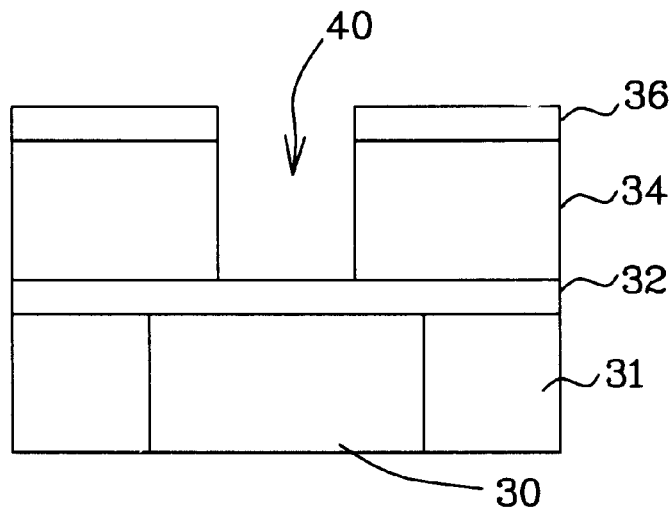
Figure 2C:
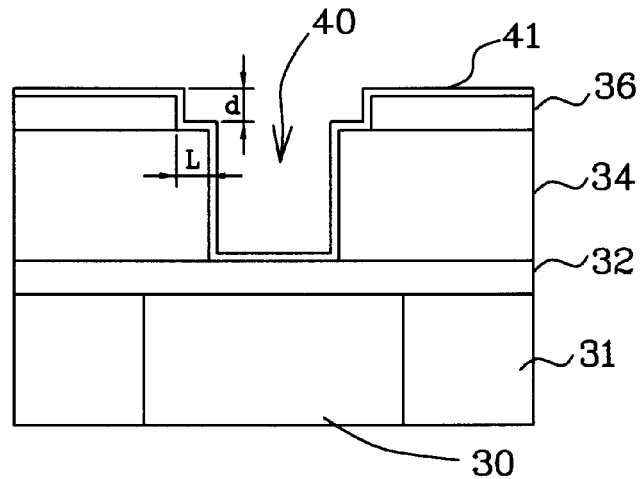

In FIG. 2c, a pull-back step for the etch-stop layer 36 is applied, such that the etch-stop layer 36 around the top of the via hole 40 and the sidewall of the via hole 40 is removed to form a step between the via hole 40 and the remaining etch-stop layer 36 with a distance L. Up to now, the etch-stop layer 36 is almost formed with silicon nitride and the thickness d of the etch-stop layer is typically around 1000 Angstroms, in which the pull-back distance L is around 200 Angstroms for the case. Then a liner 41 is deposited and overlaid on the etch-stop layer 36 and the sidewall of the via hole 40 by chemical vapor deposition (CVD). The preferred material for the liner 41 is silicon nitride or barrier low k (BLOK™), and the thickness of the liner 41 is around 50 Angstroms. Since there is a distance L between the etch-stop layer 36 and the sidewall of the via hole 40, optical path difference d can be enhanced. On the other hand, the liner 41 is formed of material with high barrier capability, such as silicon nitride (k is in the range of 7.2–7.5) or BLOK™ (k is about 5). Preferably, the k value of the BLOK™ is smaller than that of $Si_3N_4$, and the liner 41 has a strong structure to prevent penetration of conductive ions. Dielectric constant of the liner 41 is larger than that of the low dielectric constant layer 34. Due to difference between these two dielectric constants, interference and diffraction would be present so as to be advantageous to the subsequent mask alignment.

Figure 2D:
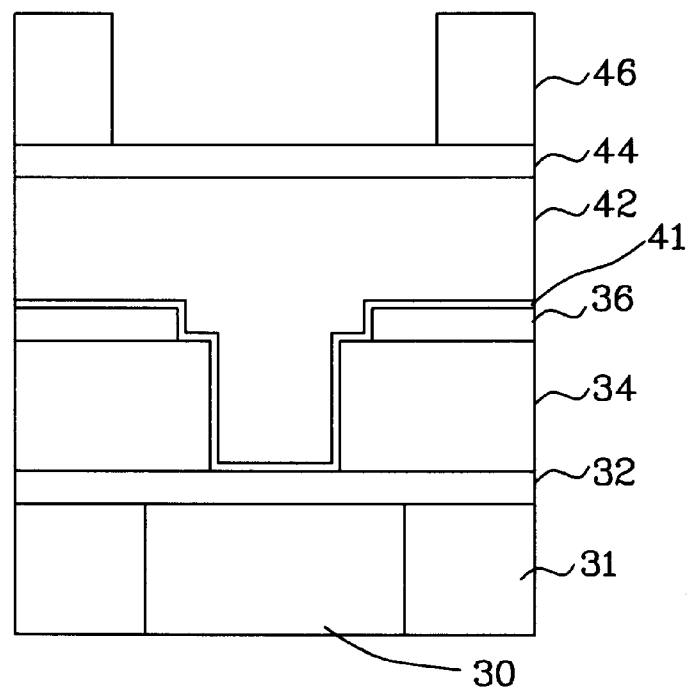
Figure 2E:
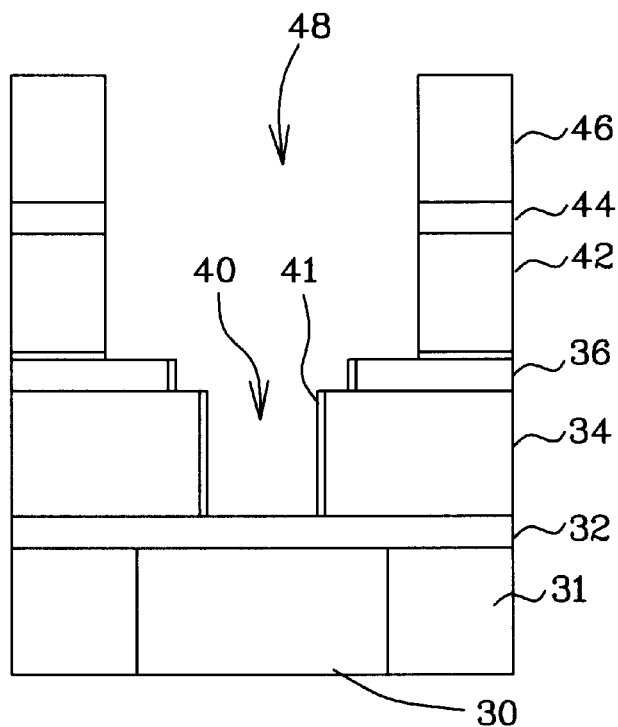

After that, as shown in FIG. 2d, a second low dielectric constant layer 42 is formed onto the liner 41 and filled in the via hole 40, and then a BARC or hard mask 44 is formed onto the second low dielectric constant layer 42 to serve as an etch-stop layer. The BARC or hard mask 44 is formed of material different from the barrier layer 32, such as Tetra-Ethyl-Ortho-Silicate (TEOS) oxide or BARC. The second low dielectric constant layer 42 and the first low dielectric constant layer 34 can be formed of the same material. A portion of the photoresist 46 is removed by exposure and development, and the remaining photoresist 46 is used as a mask for the subsequent etching process. An opening is formed in a portion of the BARC 44 which is not covered with the photoresist 46. Then anisotropic etching is applied through the opening to remove the underlying second low dielectric constant layer 42 to the top surface of the barrier layer 32, as shown in FIG. 2e, this process is called self-aligned dual-damascene etch.

Figure 2F:
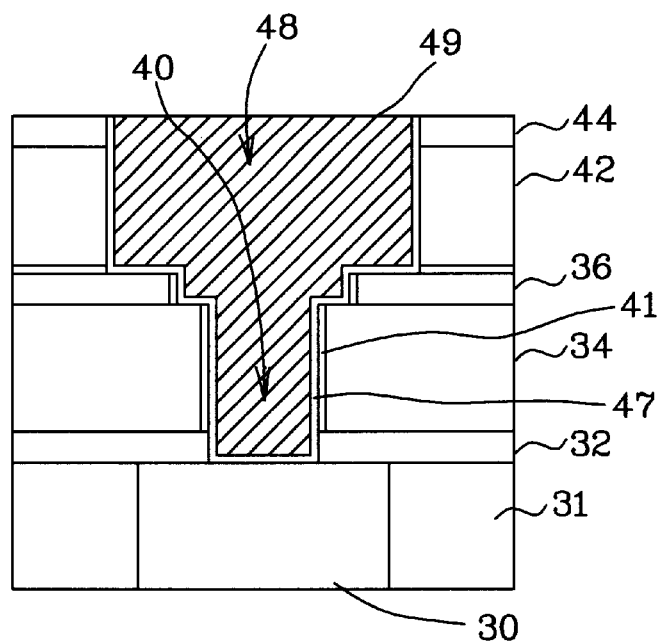
Figure 3A:
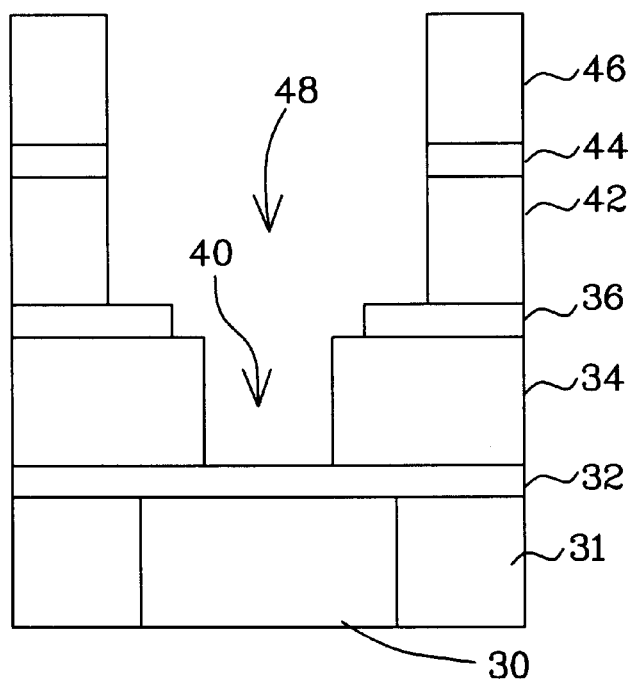
FIGS. 3a to 3d show cross sectional views during a process flow for a dual damascene according to another embodiment of the present invention, in which a pull-back step for the intermediate etch-stop layer and a liner deposition for the first and second low dielectric constant layers are provided.
Figure 3B:
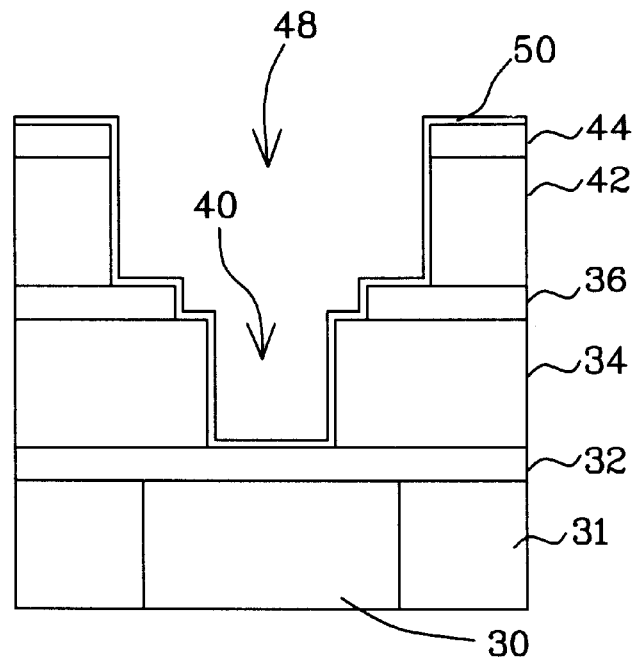
Figure 3C:
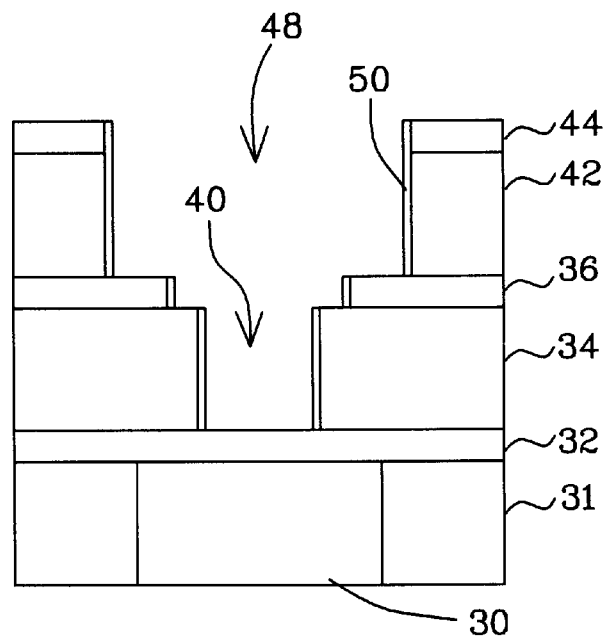
Figure 3D:
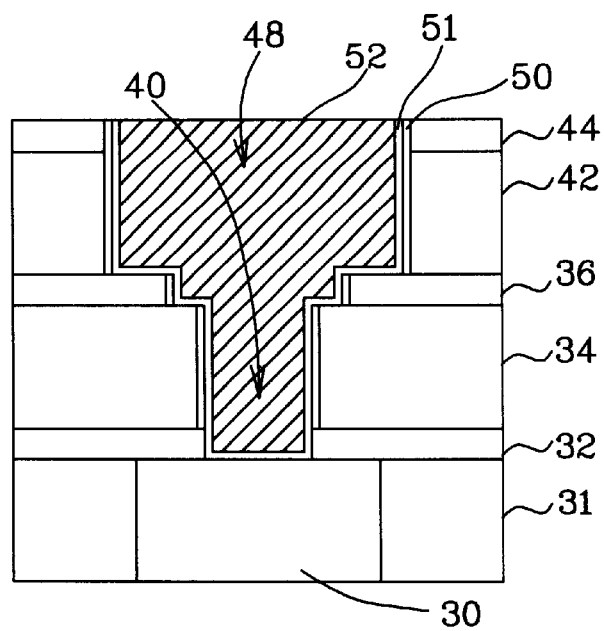

After the removal of the photoresist 46, the exposed portion of the barrier layer 32 underneath the via hole 40 is removed by anisotropic etching, such as plasma etching. As shown in FIG. 2f, since the liner 41 is covered on the sidewall of the first low dielectric constant layer 34 where the via hole 40 is formed therewith, when the exposed portion of the barrier layer 32 underneath the via hole 40 is opened by plasma etching, conductive particles, such as copper ions, sputtered up from the conductive region 30 during the etching process are under prevention from penetrating into the first low dielectric constant layer 34, so that leakage current resulted from out-diffusion of conductive particles such as copper are avoided. As in the prior art, a conductor 49 is subsequently filled in the via hole 40 and the trench 48 after the sidewalls of the via hole 40 and the trench 48 are deposited with a passivation layer 47, for example Ta/TaN. The passivation layer 47 is inserted between the conductor 49 and the sidewall of the trench 48 and between the conductor 49 and the liner 41. Such steps are well-known to those skilled in the art.

An alternate process for forming a liner to protect the low dielectric constant layer is shown in FIG. 3. In FIG. 3a, a first low dielectric constant layer 34, a first etch-stop layer 36, a second low dielectric constant layer 42, and a second etch-stop layer 44 are formed in stack onto a barrier layer 32 which is covered on a conductive region 30 such as copper, and a via hole 40 and a trench 48 are formed respectively in the first low dielectric constant layer 34 and the second low dielectric constant layer 42. Also, a pull-back distance between the first etch-stop layer 36 and the via hole 40 is formed in the structure shown in FIG. 3a. As shown in FIG. 3b, a liner 50 is then deposited onto the sidewalls of the stacked structure. Subsequently, the portion of the liner 50 in the bottom of the via hole 40, which is also the one covered on the barrier layer 32, is removed so as to be that shown in FIG. 3c. Now the exposed portion of the barrier layer 32 underneath the via hole 40 is removed by plasma etching to expose the conductive region 30. Thus, the liner 50 on the sidewalls of the trench 48 and the via hole 40 will block the conductive particles such as copper sputtered up from the conductive region 30 during the removal process of the exposed barrier layer 32 and thereby protect the low dielectric constant layers 34 and 42 from penetration of the sputtered species. Also as in the prior art, a conductor 52 is subsequently filled in the via hole 40 and the trench 48 after the sidewalls of the via hole 40 and the trench 48 are deposited with a passivation layer 51, for example Ta/TaN. The passivation layer 51 is inserted between the conductor 52 and the liner 50. Such steps are well-known to those skilled in the art.

By the pull-back of the intermediate etch-stop layer between the two layers of low k dielectrics, the photo alignment signal is enhanced. With the liner deposition, the low dielectric constant layer is protected from penetration of conductive particles such as copper. An improved dual damascene process and structure is thus obtained.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A dual damascene process for a semiconductor device with a barrier layer, a first low dielectric constant layer, and a first etch-stop layer in a stack thereof, said process comprising, in the following order, the steps of:

forming a via hole extending through said first etch-stop layer and said first low dielectric constant layer to an upper surface of said barrier layer;

depositing a liner;

forming a second low dielectric constant layer and a second etch-stop layer;

forming a trench extending through said second etch-stop layer and said second low dielectric constant layer and connecting with said via hole;

removing a portion of said barrier layer underneath said via hole for exposing a conductive region;

depositing a passivation layer; and filling in said trench and said via hole with a conductor.

2. The process according to claim 1, further comprising forming said conductive region by a copper process.

3. The process according to claim 1, wherein said liner comprises a $Si_3N_4$ layer formed by CVD.

4. The process according to claim 1, wherein said liner comprises a BLOK™ formed by CVD.

5. The process according to claim 1, further comprising a pull-back of said first etch-stop layer before depositing said liner.

6. A dual damascene process for a semiconductor device with a barrier layer, a first low dielectric constant layer, a first etch-stop layer, a second low dielectric constant layer, and a second etch-stop layer in a stack thereof, said process comprising the steps of:

forming a trench extending through said second etch-stop layer and said second low dielectric constant layer and connecting with a via hole extending through said first etch-stop layer and said first low dielectric constant layer to an upper surface of said barrier layer;

applying a pull-back of said first etch-stop layer;

depositing a liner;

removing a portion of said barrier layer underneath said via hole for exposing a conductive region;

depositing a passivation layer; and filling in said trench and said via hole with a conductor.

7. The process according to claim 6, further comprising forming said conductive region by a copper process.

8. The process according to claim 6, wherein said liner comprises a $Si_3N_4$ layer formed by CVD.

9. The process according to claim 6, wherein said liner comprises a BLOK™ formed by CVD.

* * * * *